United States Patent
Reber et al.

(10) Patent No.: US 10,943,826 B2
(45) Date of Patent: Mar. 9, 2021

(54) METHOD FOR ARRANGING A PLURALITY OF SEED SUBSTRATES ON A CARRIER ELEMENT AND CARRIER ELEMENT HAVING SEED SUBSTRATES

(71) Applicant: NexWafe GmbH, Freiburg (DE)

(72) Inventors: Stefan Reber, Gundelfingen (DE); Kai Schillinger, Freiburg (DE)

(73) Assignee: NexWafe GmbH, Freiburg (DE)

(*) Notice: Subject to any disclaimer, the term of this patent is extended or adjusted under 35 U.S.C. 154(b) by 0 days.

(21) Appl. No.: 16/335,911

(22) PCT Filed: Aug. 24, 2017

(86) PCT No.: PCT/EP2017/071368
§ 371 (c)(1),
(2) Date: Mar. 22, 2019

(87) PCT Pub. No.: WO2018/054651
PCT Pub. Date: Mar. 29, 2018

(65) Prior Publication Data
US 2019/0214302 A1    Jul. 11, 2019

(30) Foreign Application Priority Data
Sep. 22, 2016   (DE) .......................... 102016117912.4

(51) Int. Cl.
*H01L 21/78* (2006.01)
*H01L 21/02* (2006.01)
(Continued)

(52) U.S. Cl.
CPC ............ *H01L 21/7813* (2013.01); *C25F 3/12* (2013.01); *H01L 21/0243* (2013.01);
(Continued)

(58) Field of Classification Search
None
See application file for complete search history.

(56) References Cited

U.S. PATENT DOCUMENTS

2004/0206444 A1    10/2004  Letertre et al.
2013/0011630 A1*    1/2013  Sullivan ............... C09D 183/14
                                                  428/195.1
(Continued)

FOREIGN PATENT DOCUMENTS

DE    102013219886    4/2015
WO    2013004851      1/2013

OTHER PUBLICATIONS

Brendel, R: "Review of Layer Transfer Processes for Crystalline Thin-Film Silicon Solar Cells", Japanese Journal of Applied Physics, Japan Society of Applied Physics, vol. 40, No. 7, Part 1, pp. 4431-4439, Jul. 1, 2001.
(Continued)

*Primary Examiner* — Steven B Gauthier
(74) *Attorney, Agent, or Firm* — Volpe Koenig

(57) ABSTRACT

A method for arranging a plurality of semiconductor seed substrates on a carrier element, in which for applying a semiconductor layer to the seed substrates, the seed substrates are arranged on the carrier element by integral bonding. A carrier element having integrally bonded seed substrates for coating with a semiconductor layer is also provided.

18 Claims, 9 Drawing Sheets

(51) Int. Cl.
*H01L 31/18* (2006.01)
*C25F 3/12* (2006.01)

(52) U.S. Cl.
CPC .. *H01L 21/02381* (2013.01); *H01L 21/02532* (2013.01); *H01L 21/02576* (2013.01); *H01L 21/02658* (2013.01); *H01L 21/7806* (2013.01); *H01L 31/1892* (2013.01); *Y02E 10/50* (2013.01)

(56) References Cited

U.S. PATENT DOCUMENTS

2014/0370650 A1* 12/2014 Moslehi ............ H01L 31/18
 438/98
2016/0211154 A1 7/2016 Reber et al.

OTHER PUBLICATIONS

Schmich, E et al: "Silicon CVD Deposition for Low Cost Applications in Photovoltaics", Surface and Coatings Technology, Amsterdam, Netherlands, vol. 201, No. 22-23, pp. 9325-0329, May 3, 2007.

Narusawa, U.: "Si Deposition for Chlorosilanes" I. Deposition Modeling, Departement of Mechanical Engineering, Northwestern University, Boston, MA 02115, J. Electrochem Society, vol. 141, No. 8, 6 pages, Aug. 1994.

Smith, R.L., et al.: "Porous Silicon Formation Mechanisms", Journal of Applied Physics 71, R1 (1992), pp. 22, https://doi.org/10.1063/1.350839, Published Aug. 17, 1998.

Habuka, H, et al.: Model on Transport Phenomena and Epitaxial Growth of Silicon Thin Film in SiHCl3—H2 system under Atmospheric Pressure, Journal of Crystal Growth 169 (1996), pp. 61-72, Apr. 1996.

* cited by examiner

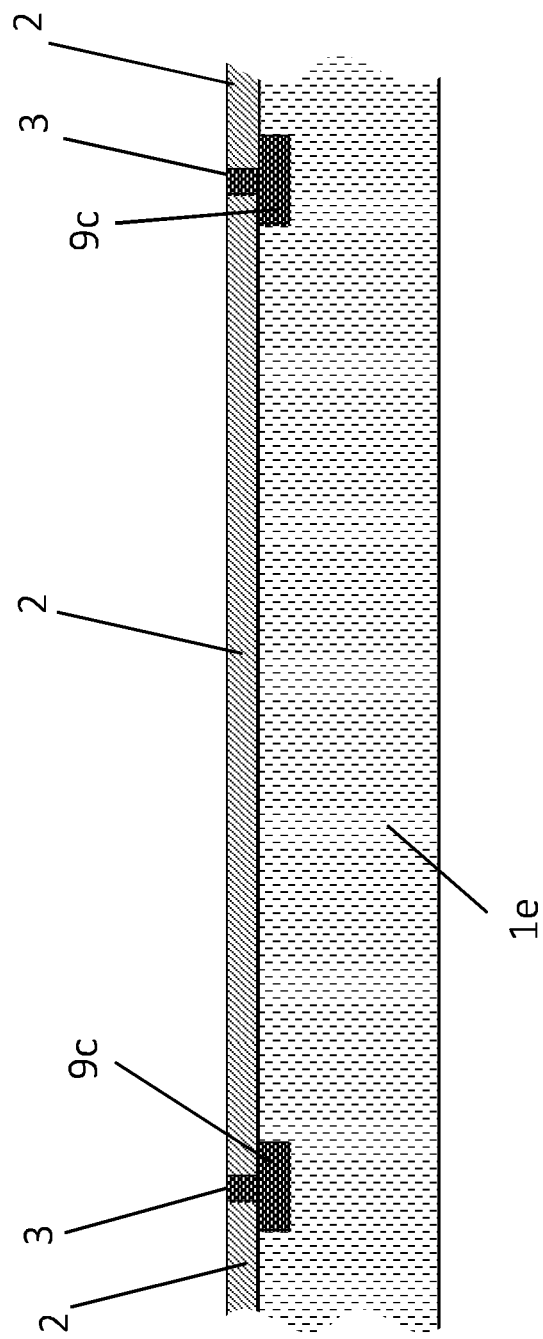

METHOD FOR ARRANGING A PLURALITY OF SEED SUBSTRATES ON A CARRIER ELEMENT AND CARRIER ELEMENT HAVING SEED SUBSTRATES

BACKGROUND

The invention relates to a method for the arrangement of a plurality of seed substrates on a carrier element and to a carrier element with seed substrates.

For large surface area electronic components, for example, large surface area light emitting elements (OLEDs) or photovoltaic solar cells, there is a need for cost-effective semiconductor wafers with high electronic quality, because for such components, the material costs of the semiconductor wafer represent a significant portion of the costs for the whole product. For producing semiconductor wafers, methods are known, wherein semiconductor wafers are produced from silicon blocks ("ingots") by sawing methods. In this way, high-quality, in particular, monocrystalline semiconductor wafers can be produced. The production costs, however, are high, also due to the loss of materials during the sawing of the silicon blocks.

Therefore, alternative methods have been developed in which a semiconductor layer is deposited on a seed substrate and is then removed from the carrier substrate. The removed semiconductor layer thus forms the semiconductor wafer for producing the electronic component.

For such methods for producing a semiconductor layer, various optimizations have been performed, for example, in WO 2013/004851 A1, the surface area of potentially parasitic deposits is minimized during the coating process.

In the previously known method, in which a semiconductor layer is deposited on a seed substrate and is then removed, the seed substrates are arranged on a carrier element during the deposition process. This planar carrier element has holders in which the seed substrates are inserted before the deposition of the semiconductor layer. After deposition of the semiconductor layer, the seed substrates are taken from the carrier element, in order to remove the semiconductor layer.

SUMMARY

The present invention is based on the objective of improving the above-mentioned carrier element and its use.

This objective is achieved by a method and a carrier element having one or more features of the invention. Advantageous constructions of the method according to the invention as well as the carrier element according to the invention are described below and in the claims.

The method according to the invention is constructed preferably to be performed by the carrier element according to the invention, especially a preferred embodiment hereof. The carrier element according to the invention is preferably formed for use in the method according to the invention, especially a preferred embodiment hereof.

The invention is based on the knowledge that in the previous production methods, in which a semiconductor layer is deposited on a semiconductor seed substrate and is then removed, a semiconductor layer has considerable costs and also flaws where damage or breaking of the semiconductor seed substrate and/or the semiconductor layers can occur, due to the use of different carrier elements for different processing steps and the arrangement and removal of the semiconductor seed substrates on the carrier elements between the processing steps. Studies have shown that a permanent fixing of the semiconductor seed substrates on the carrier element during at least one, preferably during a plurality of processing steps leads to considerable simplification and reduction of risk factors. Starting from this finding, there is thus the need for a permanent fixing for the processing steps, which, however, can be selectively removed for renewing the semiconductor seed substrates on the carrier element.

In the method according to the invention, a plurality of semiconductor seed substrates is arranged on a carrier element, in order to enable an application of a semiconductor layer on the seed substrates. It is essential that the seed substrates are arranged on the carrier element by an integral material bond.

The arrangement of the semiconductor seed substrates by an integral material bond on the carrier element has the following advantages:

The carrier elements do not require any plug-in or clamping elements for the seed substrates and thus can be produced more economically and more robust. In addition, shadows formed on the seed substrates by plug-in or clamping elements are eliminated during the coating process.

The risk of fracture of the seed substrates when the carrier element is changed between individual processing steps is prevented.

Additional economical processing options are created, for example, a surface treatment of all seed substrates already deposited on the carrier element.

The arrangement of the seed substrates by an integral material bond on the carrier elements permits a smaller distance between the seed substrates, so that, for a given surface area of the carrier element, a greater yield can be achieved in the production of semiconductor layers.

The integral material bond leads to mechanical stabilization of the seed substrates, so that the use of thinner seed substrates is possible in comparison with previously known methods for seed substrates held in plug-in modules or by clamps.

Through the stabilization of the seed substrates by an integral material bond on the carrier element, the number of production cycles, for which the seed substrates are used for producing semiconductor layers, can be increased, because the use of thinner seed substrates is possible. In this way, cost savings are achieved.

The objective forming the basis of the invention is further achieved by a carrier element having seed substrates for coating with a semiconductor layer, wherein the seed substrates are arranged on the carrier element. It is essential that the seed substrates are arranged by an integral material bond on the carrier element. In this way, the previously mentioned advantages are produced.

The deposition of the semiconductor layer is preferably performed by chemical vapor deposition (CVD).

It is especially advantageous to deposit the semiconductor layer epitaxially, in particular, by CVD.

For the deposition of a semiconductor layer, especially an epitaxial deposition, the seed substrate is typically heated to temperatures greater than 800° C., especially in the range from 800° C. to 1400° C. The integral material bond is advantageously constructed such that it is temperature resistant for temperatures up to 1000° C., especially up to 1200° C., preferably up to 1400° C.

The integral material bond between the seed substrate and carrier element is preferably formed by a material or a combination of materials from the group silicon, germanium, GaAs and other III-V semiconductors, carbon, oxygen, SiC, II-VI semiconductors. These materials have in common that a temperature resistant integral material bond is formed that is also stable in the process of a deposition of a semiconductor layer, especially an epitaxial deposition.

Preferably, the integral material connection between the seed substrate and carrier element is formed all-around a semiconductor material. This has the advantage that identical deposition techniques can be used for forming the integral material bond and also for generating the semiconductor layer on the seed substrate. Furthermore, as integral material bond, the semiconductor material has high temperature stability. In addition, semiconductor material has good adhesion to the seed substrates. In particular, it is advantageous to use the same semiconductor material that is used for forming the semiconductor layer also for forming the integral material bond.

Preferably, the integral material bond is formed by chemical vapor deposition (CVD).

Preferably, the integral material bond is formed by epitaxial deposition.

This produces the advantage that known methods and devices can be used. In particular, in one advantageous embodiment, the method and especially preferably also the device with which the semiconductor layer is subsequently produced, can be initially used, especially in a preparatory step, for the integral material bond between the seed substrate and carrier.

Here, it is advantageous to first place the seed substrate on the carrier, especially without the seed substrates being held by a plug-in fixing module. Then the formation of the integral material bond is performed, preferably by a semiconductor material, especially preferred by a CVD process. Before a subsequent formation of the semiconductor layer on the seed substrate, it is advantageous to first treat the surface of the seed substrate, especially to clean it, preferably by etching steps and/or a porosification step, as explained in detail farther below.

In another advantageous embodiment, for fixing the seed substrates on the carrier by an integral material bond, first the seed substrates are fixed by a detachable holding device, especially preferred by a detachable clamping device, on the carrier. Such devices can be formed, for example, as detachable, screw-in, or plug-in holders, plug-in spring elements, or screw-in spring arms. After the formation of the integral material bond, the detachable fixing elements are removed, so that the holding elements do not cause interfering effects in a subsequent processing step, in which the semiconductor layer is formed on the seed substrate.

For forming a qualitatively high-quality semiconductor layer, it is essential that the semiconductor seed substrates have, on the side that faces away from the carrier element and on which the semiconductor layer is produced, a defined surface that is optimized for the layer generation process. Advantageously, therefore, before forming the integral material bond between the seed substrate and carrier element, the side of the seed substrates facing away from the carrier element is pretreated, in particular, subject to a porosification step. In this way, it is achieved that, after forming the integral material bond, a deposition of the material of the integral material bond performed optionally on the side of the seed substrate facing away from the carrier element can be easily removed.

Advantageously, after forming the integral material bond between the seed substrate and carrier element and before depositing the semiconductor layer on the seed substrate, the side of the seed substrates facing away from the carrier element is pretreated, especially by cleaning and/or etching and/or porosification. Alternatively or additionally, it is advantageous to provide the side of the seed substrates facing away from the carrier element with a cover layer. Such a cover layer can be formed as a dielectric, for example, an oxide or nitride of the semiconductor layer and has the advantage that such a layer can be removed using wet-chemical methods without removing the integral material bond consisting of the semiconductor material or a component thereof. In this way, the side facing away from the carrier element is effectively protected during the formation of the integral material bond, whereby this side is made available to subsequent processes.

Advantageously, at least one semiconductor layer is deposited, preferably epitaxially, on the seed substrates arranged on the carrier element. Here, in the scope of the invention, a separate semiconductor layer is deposited on each seed substrate. It is also in the scope of the invention that a semiconductor layer that covers multiple, especially all, seed substrates, is deposited.

The semiconductor layer is advantageously removed from the seed substrates without separating the integral material bond between the seed substrate and carrier element. This produces the advantage that during the separation process, the seed substrate is used for generating a semiconductor layer, without there being the need to remove the seed substrate from the carrier.

Preferably, a silicon layer is deposited on the seed substrate, preferably with a thickness in the range from 20 µm to 500 µm, especially in the range from 30 µm to 300 µm, especially preferred epitaxially.

Preferably, the seed substrate is formed from the same semiconductor material, from which the semiconductor layer is generated. In an especially preferred way, the method according to the invention and the carrier element according to the invention are used for producing silicon semiconductor layers that are used as silicon wafers for producing semiconductor components, especially photovoltaic solar cells. The seed substrates are therefore preferably formed as silicon substrates, for example, silicon wafers.

As previously described, for a high quality of the semiconductor layer, an optimized surface of the seed substrate is advantageous. It is known to pretreat the side of the seed substrate facing away from the carrier element by porosification, in order to achieve, on one hand, a defined surface for producing the semiconductor layer and, on the other hand, a defined removal area for removing the produced semiconductor layer that allows removal with reduced risk of fracture. Such a method and a suitable device is known from DE 10 2013 219 886 A1. The porosification is realized in that a one-sided etching process is performed on the side of the seed substrate on which the semiconductor layer is to be generated in a subsequent processing step. Here it is known to merely wet this side with an electrolyte and to generate an etching current between the electrolyte and the seed substrate by a constant power source, so that one-sided etching is performed. This is also described in DE 10 2013 219 886 A1.

Advantageously, initially an arrangement of the seed substrates on the carrier element is realized by an integral material bond and then a one-sided treatment of the seed substrates on the side facing away from the carrier element by a one-sided etching process, especially preferred, for porosification, preferably by a method as described in DE 10 2013 219 886 A1. This produces the advantages that a plurality of seed substrates, which are arranged on the carrier element, can be subject to a porosification step simultaneously and, in addition, any residue of the material of the integral material bond on the side of the seed substrates facing away from the carrier element can be removed and/or smoothed out in this process.

Advantageously, doped seed substrates with a dopant of the n or p dopant type are used. These have the advantage that established, electrochemical processes can be used for the porosification, as described, e.g., in Smith et al.: *J. Appl. Phys.* 71, R1 (1992); doi: 10.1063/1.350839. Here, it is especially advantageous to form the integral material bond between the seed substrate and carrier element comprising a doped semiconductor material, especially by an n or p doped semiconductor material, wherein the integral material bond preferably has the opposite dopant type relative to the dopant type of the seed substrates. This produces the advantage that for an etching process in which the surface of the seed substrates is wetted by an electrolyte on one side and is formed by the application of an etching current of the etching process, selectively by the interaction of the electrolyte and dopant type of the seed substrate, an etching of only the surface of the seed substrates, but not the integral material bond can be realized. This is enabled by the blocking effect for electrical currents at the transition between two differently doped semiconductor areas and also the significantly different etching processes for n or p type doped semiconductor layers.

In another advantageous construction, the integral material bond is produced with identical dopant type, preferably also with identical concentration of dopants, in order to also perform surface porosification for the integral material bond. This has the advantage that for the growth of the semiconductor layer, especially for the epitaxial growth, the integral material bond of seed substrate and carrier element is indeed made thicker, but this thicker section can then also be removed for the removal of the produced semiconductor layer. In this way it can be guaranteed that the compound of the seed substrate, integral material bond, and carrier element on the side facing away from the carrier element forms a flat, step-free surface.

An opposite dopant type of the integral material bond on one hand and the seed substrates on the other hand also has the advantage that an etching process can also be performed selectively, which attacks only on the integral material bond, so that by such an etching process, the integral material bond can be selectively removed, especially in order to remove and replace the seed substrates from the carrier.

Preferably, the formation of the integral material bond between the seed substrate and carrier is realized such that the seed substrates are placed on a surface of the carrier element and an integral material bond with the carrier element is formed at least in some areas on lateral side ends of the seed substrates. In particular, it is advantageous that a seed substrate is connected by an integral material bond to the carrier element and to an adjacent seed substrate. In this advantageous embodiment, the fixing of the seed substrates is thus realized preferably essentially, in particular, preferably exclusively, by integral material bonds that are arranged laterally on the seed substrates and bond, on one side, to the lateral end sides of the seed substrates and, on the other side, to a surface of the carrier element. This produces a laterally changing sequence of seed substrate/integral material bond, wherein an integral material bond is arranged between two seed substrates and attaches to the two opposing end sides of the adjacent seed substrates and to a surface of the carrier element.

Here, a simple, process-specific method is specified in which the seed substrates are placed on the carrier element and then connected to the carrier element, in particular, preferably by a CVD process, by an integral material bond. In one advantageous construction, spacers are provided to achieve a defined lateral distance between the seed substrates and to prevent slippage during the formation of the integral material bond and the prior processing steps. Such spacers can be removable spacers that are removed after the integral material bond is formed. Likewise, spacers can be formed on the carrier element, which contact only one or multiple partial areas of the surrounding end sides of the seed substrates. For spacers that are not removed for forming the semiconductor layer, especially for spacers formed integrally with the carrier element, it is advantageous if the spacers for seed substrates arranged on the carrier element have a height that is lower than the thickness of the seed substrates. In this way, the spacers are preferably covered by the integral material bond during the formation of the integral material bond, so that even for the formation of the semiconductor layer, the semiconductor layer is formed, at most, on the integral material bond, but not directly adjacent to the spacers. In this way, a direct adhesion of the semiconductor layer on the spacers, which could increase the risk of fracture during removal, is avoided.

As previously described, it is in the scope of the invention that a semiconductor layer is deposited on each seed substrate. It is also in the scope of the invention that the semiconductor layers of two adjacent seed substrates are connected to each other, forming, in particular, a common semiconductor layer. It is preferred that, between two adjacent seed substrates, the integral material bond is arranged and that, on the side facing away from the carrier element, the integral material bond is formed with the adjacent seed substrates with a smooth surface, in particular, a common smooth surface. This can be achieved preferably in that initially the formation of the integral material bond is realized and then the smooth surface is formed in a surface treatment step, for example, by mechanical surface treatment and/or etching.

Preferably, on the seed substrates arranged on the carrier element by an integral material bond, at least one semiconductor layer is deposited, and a separating cut is performed in the area between two adjacent seed substrates before removing the semiconductor layer. This separating cut can be realized by material removal, in particular, by mechanical material removal, by ablation, in particular, by laser ablation, or by a chemical process, in particular, by an etching process. Preferably, the separating cut penetrates at least through the deposited semiconductor layer. In this way it is guaranteed that before removing the semiconductor layers, individual parts are formed, so that a manufactured semiconductor layer is allocated to each seed substrate and there is no risk of fracture during the removal of a semiconductor layer due to any connection of this semiconductor layer to an adjacent semiconductor layer.

It is in the scope of the invention to first remove the semiconductor completely. In this way, especially large surface area semiconductor layers can be manufactured. Likewise, the semiconductor layer can be cut into individual parts after removal, for example, by separating cuts, especially by sawing or by a laser.

If an integral material bond is formed between the semiconductor substrates, preferably the separating cut is realized not at all or only slightly into the area of the integral material bond, in order to prevent detachment or weakening of the integral material bond by the separating cut.

Preferably, the seed substrates are connected to the carrier element by an integral material bond at least on the side facing the carrier element. In this advantageous embodiment, an especially stable, in particular, a large surface area integral material bond between the carrier element and seed substrate can be achieved. Here, it is advantageous that the carrier element has an opening, so that the seed substrates are arranged on the carrier element and material for the integral material bond between the seed substrate and carrier element is introduced by one, preferably by multiple openings in the carrier element. Here, it is advantageous to form the integral material bond by chemical vapor deposition (CVD), in particular, by epitaxial deposition, especially at atmospheric pressure or at processing processes less than atmospheric pressure, especially by LPCVD (low pressure CVD). In this way, an infiltration of the processing gases into the carrier element and to the openings for producing the integral material bond is simplified.

In another advantageous construction, the integral material bond between the carrier element and seed substrate is formed by plasma spraying or flame spraying. In this way, fast and economical methods are possible.

In another advantageous embodiment, seed substrates are arranged on two opposite sides of the carrier element by an integral material bond. This produces the advantage that the processing space can be used for depositing the semiconductor layer in an especially space-saving way, because semiconductor layers can be deposited on both sides of the carrier element.

Here, one special advantage of the method according to the invention and the carrier element according to the invention is shown: through the integral material bond, an especially stable adhesion of the seed substrates on the carrier element is produced, so that for the individual processing steps, especially for the surface treatment, for example, by porosification before applying the semiconductor layer or by removal of the semiconductor layer, a sequential processing of the sides of the carrier is also possible, in particular, a horizontal arrangement of the carrier with underlying seed substrates connected with integral material bond. Because the integral material bond between the seed substrate and carrier prevents the seed substrates from falling or sliding, so that a simple handling is also possible for use of the carrier on both sides.

An advantageously stable and nevertheless selectively easily detachable integral material bond is produced in that the seed substrate is connected at least partially on the end sides and in a partial area on the side facing the carrier element with an integral material bond to the carrier element. In this way, an increased stability of the integral material bond is given.

Nevertheless, for example, by an etching process, the lateral integral material bond and the integral material bond only in partial areas on the side facing the carrier element can be removed. Here it is especially advantageous when the integral material bond formed on the side facing the carrier element is formed on one or more edge areas of the seed substrate, because removal of such a bond is easily possible mechanically or by an etching process in this area. This enables easier detachment of a seed substrate from the carrier element compared with a large surface area, in particular, total surface area integral material bond between the seed substrate and carrier element on the side of the seed substrate facing the carrier element.

As previously described, the method according to the invention enables a multiple use of the seed substrates. It is therefore advantageous that the seed substrates are arranged on the carrier element by an integral material bond and separated without the integral material bond between the seed substrate and carrier element, the processing sequence pretreatment of the side of the seed substrates facing away from the carrier element, application of at least one semiconductor layer on the seed substrates, detachment of the semiconductor layer from the seed substrates, is performed multiple times with or without other intermediate steps being performed in-between, in particular, at least 20 times, preferably at least 50 times. In this way, an economical production method is achieved.

Advantageously, the carrier element has at least one support for each seed substrate on which a back side of the seed substrate facing the carrier element directly contacts the carrier element. Furthermore, the carrier element has at least one recess in the edge area of each seed substrate, preferably a recess surrounding the edge of the seed substrate on which the back side of the seed substrate is connected to the carrier with an integral material bond. In this way, the previously mentioned advantages are achieved. In particular, the recess advantageously reaches underneath, at least in some areas, preferably surrounding the edge area, the back side of the seed substrate facing the carrier element.

The seed substrates preferably have edge lengths in the range from 10 cm to 50 cm and preferably have a rectangular, especially preferred, square construction. The carrier element is preferably constructed for holding at least 9, preferably at least 12, further preferred at least 16, even more preferred at least 20 seed substrates.

The semiconductor layer is advantageously built from silicon. The semiconductor layer is preferably formed by a known method, in particular, as described in Habuka et al., "Model on transport phenomena and epitaxial growth of silicon thin film in SiHCl3-H2 system under atmospheric pressure," Journal of Crystal Growth 169 (1996) 61-72 or Narusawa, "Si Deposition from Chlorosilanes," J. Electrochem. Soc., Vol. 141, No. 8, August 1994. The carrier element is preferably made from one or more of the materials: graphite, silicon, quartz, silicon carbide or silicon nitride, or composites and compounds from these materials. The carrier element preferably has a thickness in the range from 0.1 cm to 15 cm, especially preferred 0.3 cm to 8 cm. Preferably, the carrier element has a thermal expansion coefficient that is adapted to the expansion of the semiconductor layer.

The semiconductor seed substrates are preferably replaced when they are "consumed." This can be shown by a measured thickness falling below a specified minimum thickness, the completion of a specified number of processing cycles, or by individual inspections, in particular, for fractures or highly inhomogeneous wear patterns. Here, for example, by etching, the integral material bond can be completely removed, so that the seed substrates can be removed from the carrier element. Then the carrier element is reused in that new seed substrates are arranged by an integral material bond on the carrier element.

In a preferred embodiment, the thickness of the seed substrates is increased to counteract strong wear. For this purpose, material of the seed substrates is thus deposited on the side of the seed substrates facing away from the carrier element, preferably epitaxially deposited. In this case, there is no intermediate layer and, in particular, no porosification processing of the surface of the seed substrates, because the newly deposited layer is to remain permanently on the surface of the seed substrates.

In this embodiment, the thickness of the seed substrates is thus increased again by epitaxial growth, so that further use in the previously described processing cycle is possible. The increase of the thickness of the seed substrates is performed preferably when the measured thickness falls below a specified minimum thickness, after a specified number of processing cycles has been completed, or by individual inspections, in particular, optical inspections.

BRIEF DESCRIPTION OF THE DRAWINGS

Other preferred features and constructions are explained below with reference to the figures and embodiments. Shown are.

DETAILED DESCRIPTION

All of the figures show schematic illustrations not true to scale. Identical reference symbols designate identical or identically acting elements.

Figure 1:
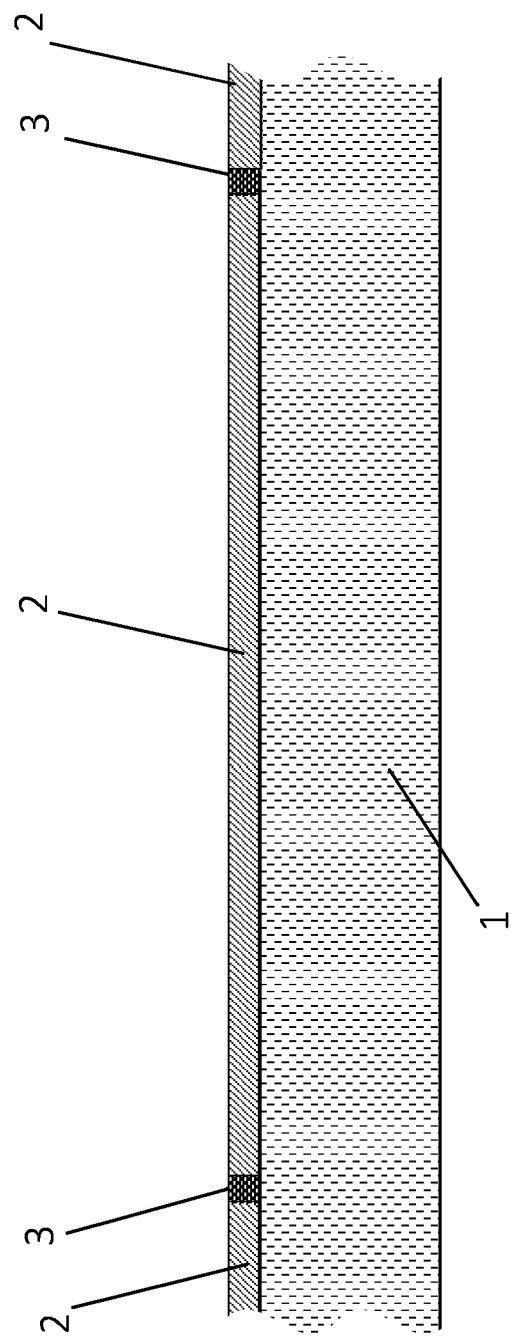
FIG. 1 a partial section view of an embodiment of a carrier element according to the invention with seed substrates connected by integral material bond, FIG. 2 a perspective partial view of the carrier element according to FIG. 1, FIG. 3 an intermediate step of an embodiment of the method according to the invention with deposited bond material, FIG. 4 another intermediate step of the embodiment of the method according to the invention after performing a separating cut, FIG. 5 another embodiment of a carrier element according to the invention with spacers, FIG. 6 another embodiment of a carrier element according to the invention with holding elements that can be attached detachably, FIG. 7 another embodiment of a carrier element according to the invention with seed substrates arranged on both sides, FIG. 8 another embodiment of a carrier element according to the invention with holding elements that can be attached detachably and large surface area, integral material bond between the seed substrate and carrier element, and FIG. 9 another embodiment of a carrier element according to the invention with seed substrates connected with integral material bond, wherein the integral material bond is performed on the end sides of the seed substrate and bounded peripherally on the side of the seed substrate facing the carrier element.

FIG. 1 shows an embodiment of a carrier element 1 on which a plurality of seed substrates 2 are arranged on a top side.

The carrier element is formed as a graphite plate and for the arrangement of 3×3 seed substrates 2. The carrier element has a thickness of 10 mm. The seed substrates are formed as silicon wafers with a square basic shape, wherein the edge length is 157 mm in the present case. The seed substrates have a p dopant using boron as the dopant, in the range from $1 \times 10^{18}$ At./cm$^3$ to $1 \times 10^{19}$ At./cm$^3$, in the present case, approximately $5 \times 10^{18}$ At./cm$^3$.

On the lateral end sides of the seed substrate 2, an integral material bond 3 is arranged between the seed substrates. The integral material bond is formed from n-doped silicon with phosphorus as the dopant, with a doping concentration in the range $5 \times 10^{14}$ At./cm$^3$ to $3 \times 10^{15}$ At./cm$^3$, in the present case, $9 \times 10^{14}$ At./cm$^3$.

The integral material bond 3 attaches, on one side, to the lateral end sides of the seed substrates 2 and, on the other side, to the surface of the carrier element 1 shown at the top in FIG. 1. The seed substrates 2 are thus fixed by the integral material bond 3 on the carrier element 1. The integral material bond 3 here covers at least 2 end sides of the seed substrate 2, advantageously all 4 end sides of the seed substrate 2.

Figure 2:
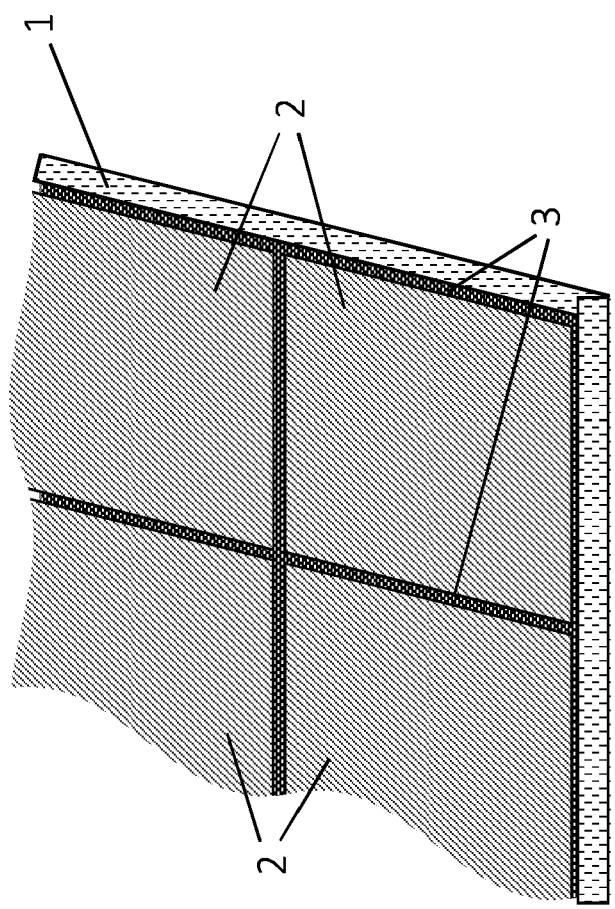

FIG. 2 shows a perspective partial view of the carrier element 1. Shown is the lower right corner, wherein four seed substrates are visible. Laterally between the lateral end sides of the seed substrates 2, an integral material bond 3 is arranged. The integral material bond is formed on all 4 end sides of the seed substrates.

FIGS. 1 and 2 thus similarly show the result of an embodiment of a method according to the invention for the arrangement of a plurality of seed substrates 2 on a carrier element 1, wherein the seed substrates 2 are arranged by an integral material bond 3 on the carrier element.

Figure 3:
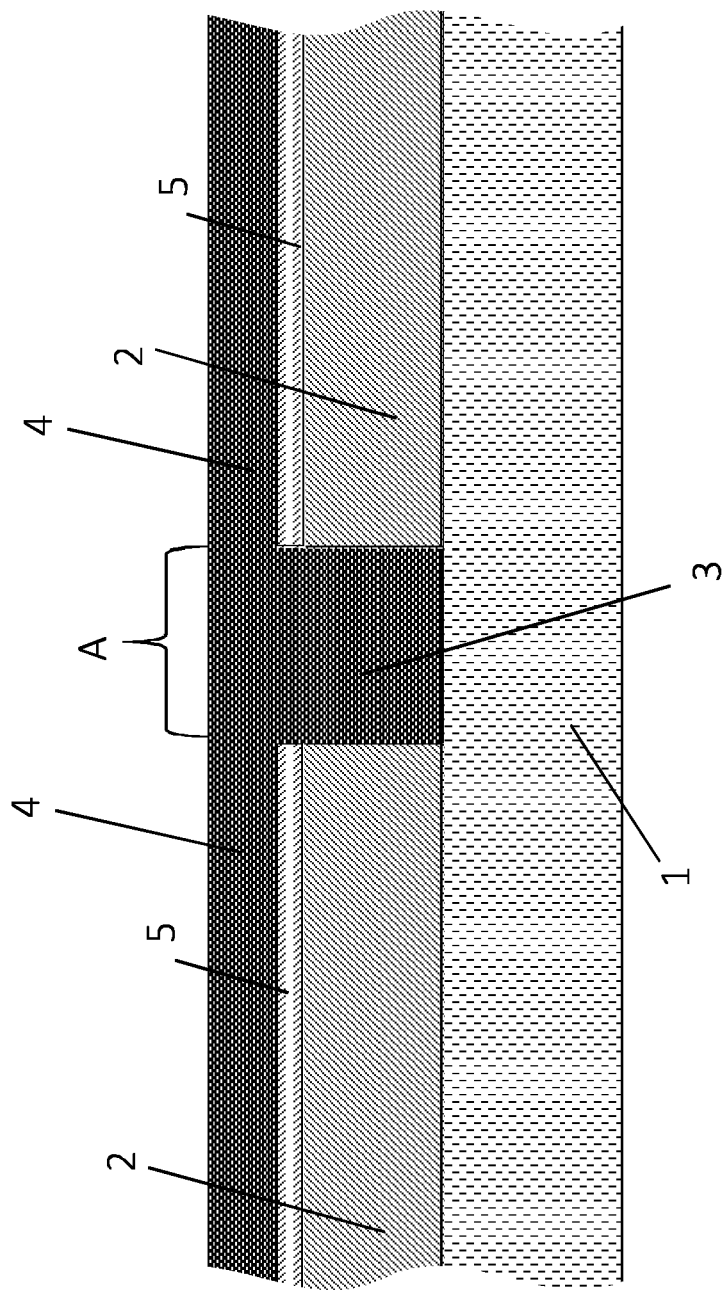

FIG. 3 shows a partial step of this first embodiment: at first, the seed substrates 2 were individual subjected to a porosification process on a surface, in order to manufacture a separating layer 5. This was performed by the known one-sided etching process, as described before. Then the seed substrates 2 were arranged on the carrier element 1 with a lateral distance A in the range from 0.1 mm to 10 mm, in the present case, 2 mm, wherein the separating layer 5 formed on the surface of the seed substrates 2 by porosification was arranged on the side facing away from the carrier element 1.

Then the carrier element was led into a system for CVD processing and silicon was deposited by chemical vapor deposition. The result is shown in FIG. 3.

The deposition led to the formation of the integral material bond 3 that connects the lateral end sides of the seed substrates 2 to the carrier element 1. In addition, however, a deposition of a parasitic integral material bond 4 on the seed substrates 2 is also realized. However, because a separating layer 5 was formed on the surfaces of the seed substrates 2, in a subsequent step, a separation of the parasitic integral material bond 4 is easily performed, so that only the integral material bond 3 remains. In the area between the parasitic integral material bond 4 and integral material bond 3, the internal material bond breaks away. Here, in a preferred embodiment, the integral material bond 3 is then smoothed mechanically or by etching, so that the side of the integral material bond 3 facing away from the carrier element 1 forms a flat surface with the side of the seed substrates 2 facing away from the carrier element 1.

Alternatively, the parasitic integral material bond 4 can be removed mechanically, in particular, ground away. For this purpose, the formation of a separating layer 5 is not absolutely necessary. Furthermore, the parasitic integral material bond 4 can alternatively be removed by etching. Here, a separating layer 5 is also not absolutely necessary. In this advantageous construction, it is especially advantageous that the seed substrates 2 have an opposite doping to the integral material bond 3. In this case, an etching process by an electrolyte and impressing of an etching current can be performed, which selectively etches only the integral material bond 3 and thus stops at the surface of the seed substrates 2.

In another advantageous modification, before removing the parasitic integral material bond 4, a separating cut is performed in the area A, especially by laser ablation that has approximately the depth of the thickness of the parasitic integral material bond 4. In this way, it is avoided in an especially efficiently way that when the parasitic integral material bond 4 is removed, damage or reduction of the adhesive force of the integral material bond 3 occurs.

Figure 4:
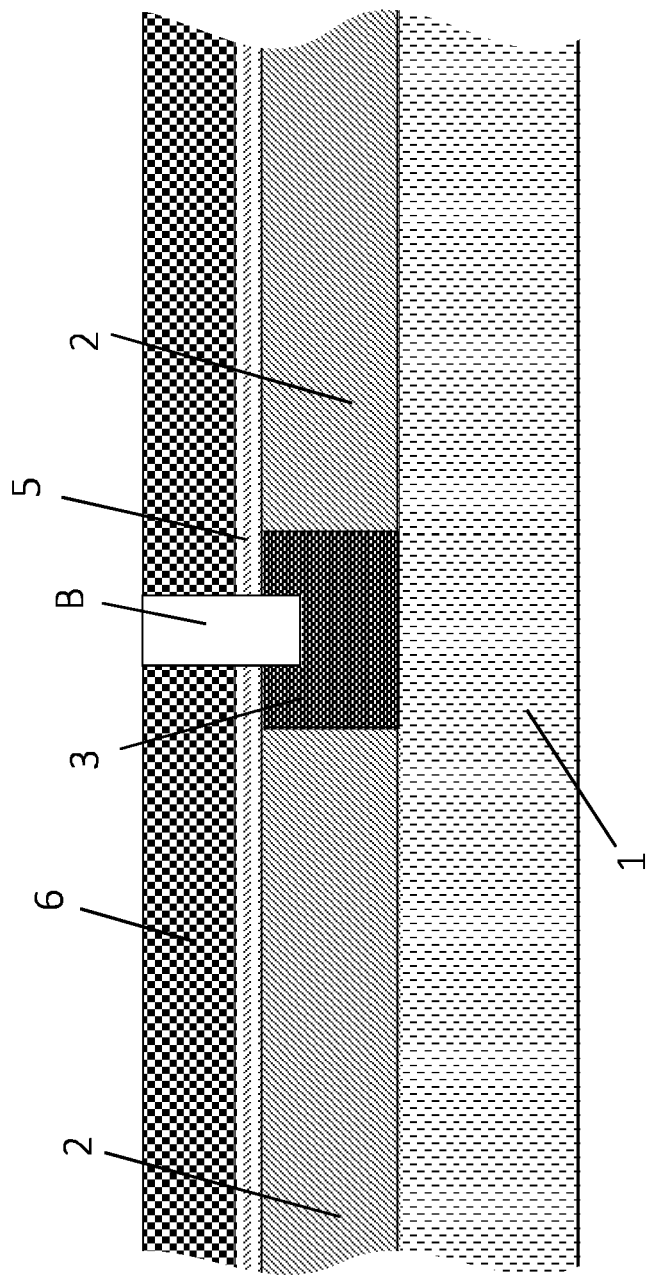

FIG. 4 shows another partial step of the first embodiment: after the arrangement of the seed substrates 2 by an integral material bond 3 and removal of the parasitic integral material bond 4, the surface of the seed substrates 2 were pretreated: by one-sided wetting with an electrolyte and impressing of an etching current, as previously described, a separating layer 5 was produced on the surfaces of the seed substrates 2 by porosification. Here, an advantage of the present invention is shown: the formation of the separating layer on the surface of the seed substrates 2 can take place without the seed substrates detaching from the carrier element 1, so that, in an efficient way, all of the seed substrates 2 arranged on the carrier element 1 can be treated on the surface in one processing step.

After the formation of the separating layer 5, the carrier element 1 was guided with the seed substrates 2, which are fixed by an integral material bond 3 on the carrier element 1, into a CVD system, in order to deposit a semiconductor layer 6 in a known way. In this embodiment, the semiconductor layer 6 extends over all seed substrates 2 and the in-between integral material bond 3, as shown in FIG. 4.

For removing the semiconductor layer 6, individual parts are first formed by separating cuts B. These separating cuts are also performed by laser ablation and separate the semiconductor layer 6 along the integral material bond 3, i.e., along the intermediate spaces between the seed substrates 2, so that, as a result, a semiconductor layer 6 is allocated to each seed substrate 2, which represents a part of the previously covering semiconductor layer 6.

The separating cut B is selected such that it completely separates at least the thickness of the semiconductor layer 6 and engages slightly (in the present case, approximately 0.05 mm) into the integral material bond 3, in order to guarantee a complete separation of the semiconductor layer 6. The separating cut B, however, cuts only slightly and in no way completely through the integral material bond 3, so that the adhesive effect of the integral material bond 3 is not negatively affected.

Then a mechanical removal of the individual semiconductor layers 6 from the seed substrates 2 is performed.

Due to the opposite doping between the seed substrates 2 on one hand and integral material bond 3 on the other hand, the separating layer 5 can also be formed thinner or not at all in the area of the integral material bond 3. In this case, for the deposition of the semiconductor layer 5, a more stable connection is formed between the semiconductor layer 6 and integral material bond 3. By the separating cut B, however, also in this case, a detachment of the individual semiconductor layers that is not susceptible to fracture is realized. Preferably, in these cases, the separating cut B has a width that corresponds to at least 90% of the distance between the seed substrates, especially preferred 90% to 99%. Likewise, the separating step can have the full width of the distance between the seed substrates or a larger width than the distance between the seed substrates, in order to reliably avoid a bond of the semiconductor layer to the area between the seed substrates.

In an alternative embodiment, the integral material bond 3 has the same dopant type as the seed substrates 2, preferably also the same dopant and especially preferred also the same dopant concentration. In this way it is guaranteed that the separating layer 5 between the semiconductor substrates 2 also extends beyond the integral material bond 3.

As can be seen in FIG. 4, this produces the advantage that the semiconductor layers 6 are slightly larger than the seed substrates 2 due to the overlapping of the integral material bond 3. In another post-treatment, an edge definition of the semiconductor layer 6 can be performed, in which, for example, the semiconductor layer 6 is cut by laser cutting around the edge area, in order to achieve the size of the seed substrate 2. In this way, first, an exact edge definition and an exact shape are given, in addition, the edge areas in which irregularities might occur on the crystal plane or for deposition of a doped semiconductor layer on the dopant plane, so that a high-quality semiconductor layer 6 is achieved.

Then a surface definition of the seed substrates 2 is performed, in which the seed substrates 2 fixed on the carrier element 1 by the integral material bond 3 are provided again, as described before, with a separating layer 5. Then the deposition of a semiconductor layer 6 is performed again. Here, it must be noted that a partial removal of the integral material bond 3 partially performed optionally in the previously performed separating cut B is filled again by semiconductor material in the now renewed deposition of a semiconductor layer 6. Then, in turn, a separating cut and a detachment of the now regenerated semiconductor layers 6 are performed.

This cycle is repeated several times, wherein with each pass, the thickness of the seed substrates due to the production of the separating layer is reduced slightly. The thickness of the seed substrates from 100 μm to 2 mm, in the present case, 0.5 mm, permits, however, the performance of a method with 100 cycles.

Here, a special advantage of the present invention is thus shown: the processing steps for the arrangement of the seed substrates on the carrier element by the integral material bond 3 must be performed only once and then a plurality of processing cycles can be performed for producing the semiconductor layers 6.

Here, it is also relevant that in each processing step, in particular, also for the detachment of the semiconductor layers 6 from the seed substrates 2, the risk of fracture of the seed substrates 2 is significantly reduced.

If the thickness of the seed substrates 2 falls below a minimum thickness, the integral material bond 3 can be completely removed, for example, by etching, so that the seed substrates can be removed from the carrier element 1. Then the carrier element is reused, in that new seed substrates 2 are arranged on the carrier element 1 as previously described by an integral material bond.

In an alternative embodiment, the thickness of the seed substrates 2 is increased again by epitaxial growth, so that another use in the previously described processing cycle is possible.

Figure 5:
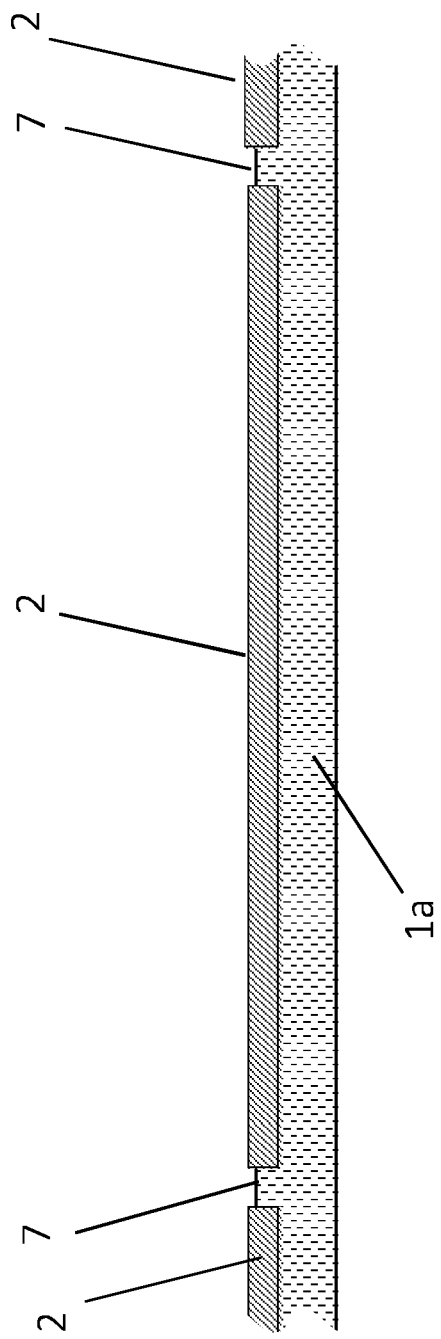

FIG. 5 shows a second embodiment of a carrier element according to the invention. This embodiment has spacers 7 that are formed integrally with the carrier element 1a. Here, on each side of the seed substrates 3, spacers 7 are arranged in an approximately equal distribution, so that a seed substrate 2 placed between the spacers 7 is fixed laterally in both spatial directions. The spacers 7; however, have a smaller height than the seed substrates 2. Due to the spacers 7, it is prevented that in the subsequent production of the integral material bond 3, a slippage of the seed substrates 2 is realized due to external influences, such as vibrations or shocks. In the areas in which the spacers 7 are arranged, the integral material bond 3 is arranged on the spacers 7. Between the spacers 7, in contrast, a cross cut is produced, as shown, for example, in FIG. 1.

Figure 6:
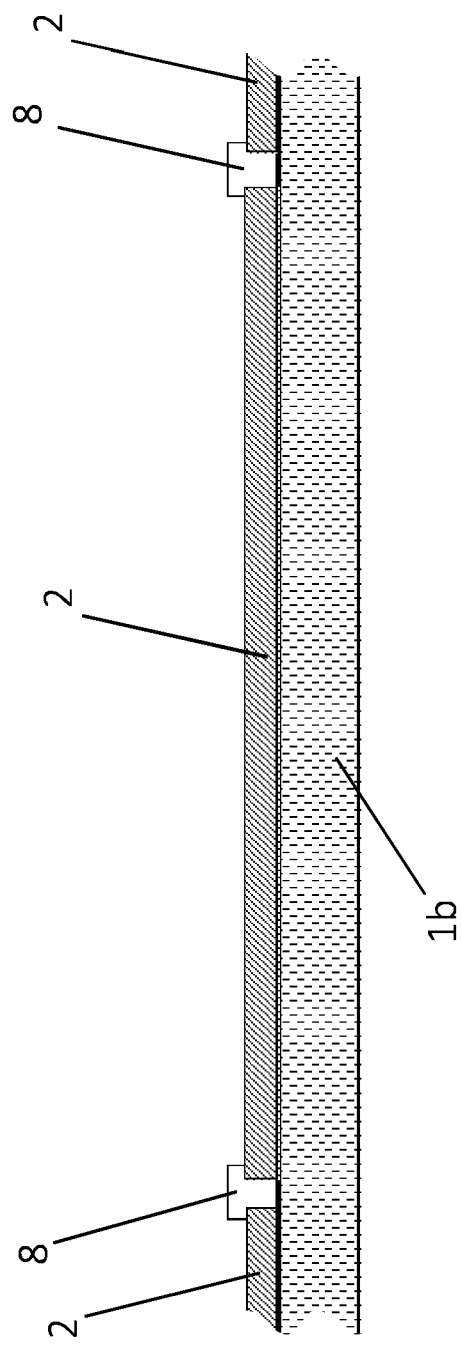

FIG. 6 shows another embodiment of a carrier element: the carrier element 1b has holes in which holding elements 8 provided with threads can be screwed. By this carrier element 1b, initially the seed substrates 2 are thus placed and then fixed by screwing in the holding elements 8, so that the seed substrates 2 are fixed in all three spatial directions, because the holding elements 8 are formed with a mushroom-shaped top.

Then the production of an integral material bond 3 is performed. This fixes the seed substrates 2 on the carrier element 1b in the areas in which no holding element 8 is located. Then the holding elements 8 can be removed easily by unscrewing them. In a subsequent processing step in which the semiconductor layer is deposited, the thread and the intermediate areas previously formed by the holding elements 8 between the seed substrates 2 are also filled by the material of the semiconductor layer.

Figure 7:
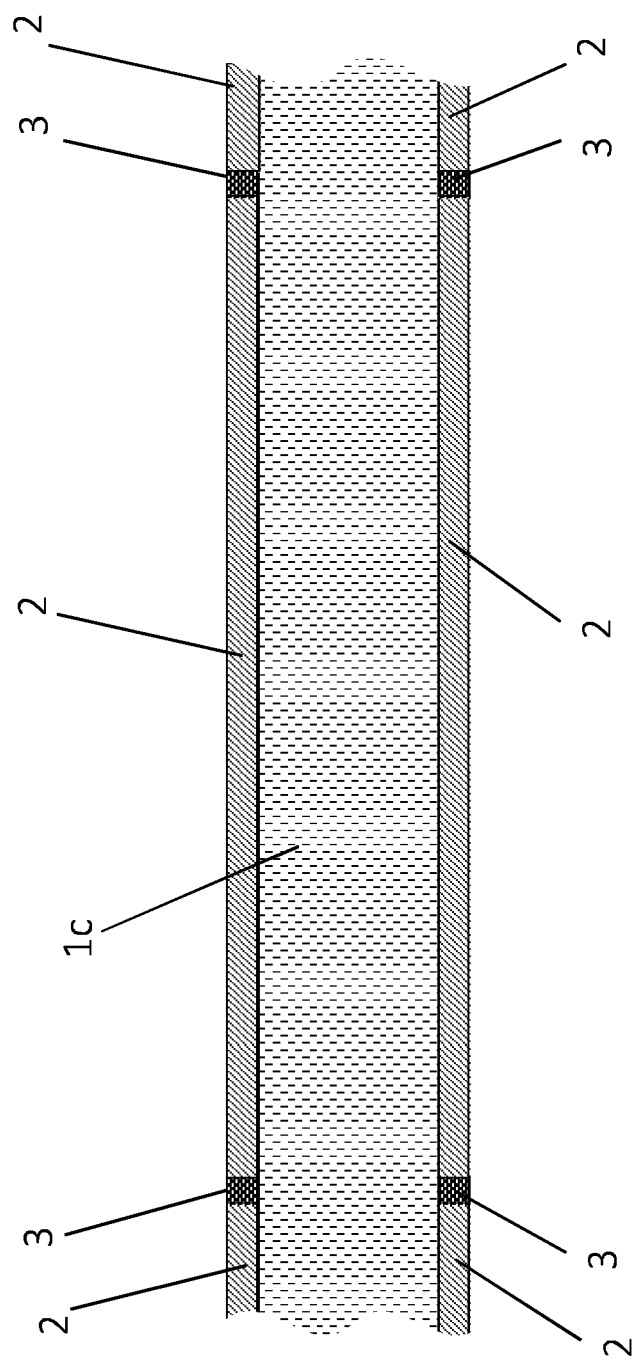

In FIG. 7, another embodiment of a method according to the invention is shown. This method basically corresponds to the first embodiment. In addition, however, after fixing the seed substrates 2 on a first side of the carrier element 1c by the integral material bond 3, by rotating the carrier element 1c, the process was repeated, in that seed substrates 2 are again arranged on the now not-covered, top side of the carrier element 1c and then fixed by an integral material bond 3.

Here, a two-sided placement of seed substrates, as shown in FIG. 7, is produced. This permits an especially efficient utilization of a deposition system for the semiconductor layer 6.

Figure 8:
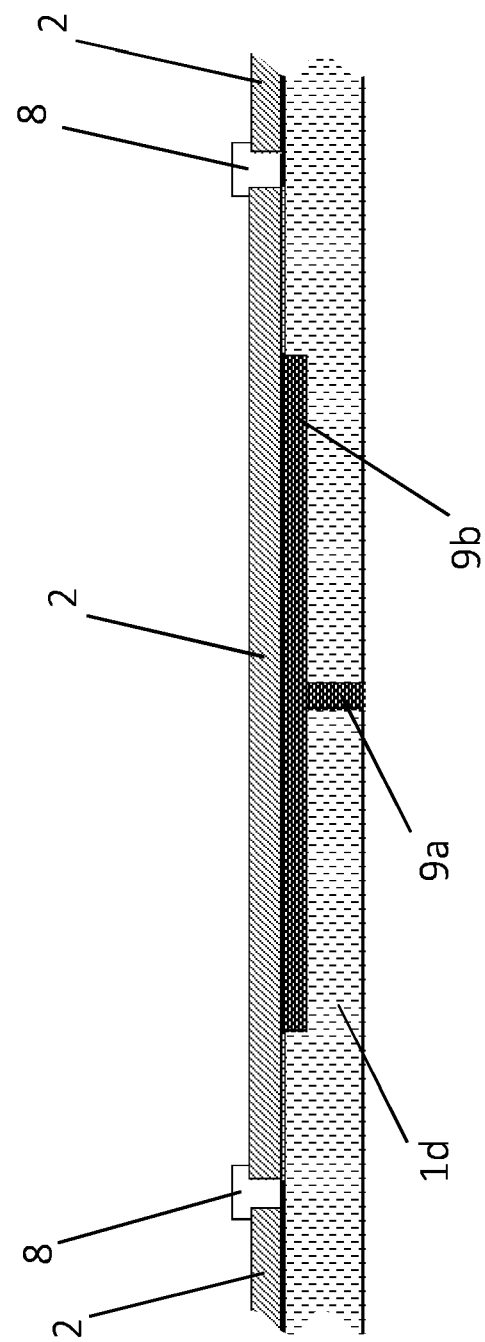

In another embodiment of a carrier element 1d according to the invention, an especially stable, planar fixing of the seed substrates 2 on the carrier element 1d is performed. As can be seen in FIG. 8, the carrier element 1d has a continuous filling opening 9a and a bond tray 9b. Here, after placement of the seed substrates 2 on the carrier element 1d, the seed substrates 2 are fixed by screwing in holding elements 8 analogous to the procedure according to FIG. 6. Then a feeding of material is performed for forming the integral material bond 3 through the filling opening 9a in the bond tray 9b. Here, the holding elements 8 prevent the seed substrates 2 from being lifted. Through the bond tray 9b, a large surface area integral material bond between the seed substrate 2 and carrier element 1d is achieved.

Then the holding elements 8 are removed and the seed substrates 2 are pretreated and a semiconductor layer 6 is deposited as described before.

In FIG. 9, another embodiment of a carrier element 1e is shown. This carrier element 1e likewise has bond trays 9c that cover, however, the intermediate spaces between the seed substrates 2 on the side of the carrier element 1e facing the seed substrates 2. Thus, in this embodiment, a filling opening is not necessary: after placement of the seed substrates 2 on the carrier element 1e, for the formation of the integral material bond 3, the bond trays 9c are also filled with integral material bond 3. The bond trays 9c reach under the seed substrates in an edge area of the back side of the seed substrates 2 facing the carrier element 1e, so that an integral material bond is realized between the carrier element 1e not only on the lateral end sides of the seed substrates 2, but also in the edge areas of the back side of the seed substrates 2. In this way, an especially stable fixing is also guaranteed.

The invention claimed is:

1. A method for arranging a plurality of semiconductor seed substrates on a carrier element (1, 1a, 1b, 1c, 1d, 1e), for application of at least one semiconductor layer (6) on the plurality of semiconductor seed substrates, the method comprising:
   placing the plurality of semiconductor seed substrates on a surface of the carrier element;
   holding the plurality of semiconductor seed substrates on the carrier element using an integral material bond; and
   forming the integral material bond (3) to the carrier element (1, 1a, 1,b, 1c, 1d, 1e) at least in some areas on lateral end sides of the plurality of semiconductor seed substrates.

2. The method according to claim 1, further comprising:
   forming the integral material bond (3) between the plurality of semiconductor seed substrate (2) and the carrier element (1, 1a, 1b, 1c, 1d, 1e) from a semiconductor material.

3. The method of claim 2, wherein the integral material bond (3) is formed using the semiconductor material that is used for forming the at least one semiconductor layer (6).

4. The method of claim 3, wherein the plurality of semiconductor seed substrates have a dopant of an n or p type, and the integral material bond (3) has a dopant of the opposite dopant type.

5. The method according to claim 1, further comprising forming the integral material bond (3) by chemical vapor deposition (CVD).

6. The method according to claim 1, further comprising for forming the integral material bond between the plurality of semiconductor seed substrates (2) and carrier element (1, 1a, 1b, 1c, 1d, 1e), pretreating a side of the plurality of semiconductor seed substrates facing away from the carrier element (1, 1a, 1b, 1c, 1d, 1e) by a porosification process or is provided with a cover layer, or both.

7. The method according to claim 6, further comprising depositing a silicon layer on the plurality of semiconductor seed substrates.

8. The method according to claim 1, further depositing the at least one semiconductor layer (6) on the plurality of semiconductor seed substrates arranged on the carrier element (1, 1a, 1b, 1c, 1d, 1e) and removing the at least one semiconductor layer (6) from the plurality of semiconductor seed substrates, without separating the integral material bond (3) between the plurality of semiconductor seed substrate (2) and carrier element (1, 1a, 1b, 1c, 1d, 1e).

9. The method according to claim 1, further comprising pretreating a side facing away from the carrier element (1, 1a, 1,b, 1c, 1d, 1e) of the plurality of semiconductor seed substrates arranged on the carrier element (1, 1a, 1,b, 1c, 1d, 1e) for deposition of the at least one semiconductor layer (6).

10. The method according to claim 9, wherein the pretreatment is a porosification process, without separating the integral material bond (3) between the plurality of semiconductor seed substrates (2) and carrier element (1, 1a, 1,b, 1c, 1d, 1e).

11. The method according to claim 1, further comprising the plurality of semiconductor seed substrates being arranged by the integral material bond on the carrier element (1, 1a, 1b, 1c, 1d, 1e) and without separating the integral material bond (3) between the plurality of semiconductor seed substrate (2) and the carrier element (1, 1a, 1b, 1c, 1d, 1e), by a processing sequence
   pretreating a side of the plurality of semiconductor seed substrates facing away from the carrier element (1, 1a, 1b, 1c, 1d, 1e),
   applying the at least one semiconductor layer (6) on the plurality of semiconductor seed substrates, removing the at least one semiconductor layer (6) from the plurality of semiconductor seed substrates, and performing the processing sequence multiple times, with or without other intermediate steps being performed in-between.

12. The method according to claim 1, further comprising at least one of depositing the at least one semiconductor layer (6) on each said plurality of semiconductor seed substrates (2) or connecting the semiconductor layers of two adjacent ones of the plurality of semiconductor seed substrates to each other on a common one of the at least one semiconductor layer (6), such that the integral material bond (3) is arranged between the two adjacent ones of the plurality of semiconductor seed substrates, and forming the integral material bond (3) with the adjacent one of the plurality of semiconductor seed substrates with a smooth surface on a side facing away from the carrier element (1, 1*a*, 1*b*, 1*c*, 1*d*, 1*e*).

13. The method according to claim 1, further comprising depositing the at least one semiconductor layer (6) on the plurality of semiconductor seed substrates arranged on the carrier element (1, 1*a*, 1*b*, 1*c*, 1*d*, 1*e*) and before removing the at least one semiconductor layer (6), performing a separating cut (B) in an area between adjacent ones of the plurality of semiconductor seed substrates.

14. The method of claim 13, wherein the separating cut (B) penetrates at least the deposited at least one semiconductor layer (6).

15. The method according to claim 1, further comprising connecting the plurality of semiconductor seed substrates at least on a side facing the carrier element (1, 1*a*, 1*b*, 1*c*, 1*d*, 1*e*) by the integral material bond to the carrier element (1, 1*a*, 1*b*, 1*c*, 1*d*, 1*e*) such that the plurality of semiconductor seed substrates are arranged on the carrier element (1, 1*a*, 1*b*, 1*c*, 1*d*, 1*e*) and material for the integral material bond between the plurality of semiconductor seed substrate (2) and carrier element (1, 1*a*, 1*b*, 1*c*, 1*d*, 1*e*) is formed by at least one opening in the carrier element (1, 1*a*, 1*b*, 1*c*, 1*d*, 1*e*).

16. The method according to claim 1, further comprising the arranging of the plurality of semiconductor seed substrates on the carrier element includes arranging the plurality of semiconductor seed substrates by the integral material bond on two opposing sides of the carrier element (1, 1*a*, 1*b*, 1*c*, 1*d*, 1*e*).

17. The method according to claim 1, wherein one of the plurality of semiconductor seed substrates (2) is connected by the integral material bond to the carrier element (1, 1*a*, 1*b*, 1*c*, 1*d*, 1*e*) and to an adjacent one of the plurality of semiconductor seed substrates (2).

18. A method for arranging a plurality of semiconductor seed substrates on a carrier element (1, 1*a*, 1*b*, 1*c*, 1*d*, 1*e*), for application of at least one semiconductor layer (6) on the plurality of semiconductor seed substrates, the method comprising:

placing the plurality of semiconductor seed substrates on the carrier element;

holding the plurality of semiconductor seed substrates on the carrier element using an integral material bond;

forming the integral material bond (3) between the plurality of semiconductor seed substrate (2) and the carrier element (1, 1*a*, 1*b*, 1*c*, 1*d*, 1*e*) from a semiconductor material, wherein the integral material bond (3) is formed using the semiconductor material that is used for forming the at least one semiconductor layer (6); and wherein the plurality of semiconductor seed substrates have a dopant of an n or p type, and the integral material bond (3) has a dopant of the opposite dopant type.

\* \* \* \* \*